(12) United States Patent
Kobayashi et al.

(10) Patent No.: US 7,144,471 B2
(45) Date of Patent: Dec. 5, 2006

(54) BONDING METHOD AND APPARATUS

(75) Inventors: Shigetaka Kobayashi, Hyogo-ken (JP);
Takeshi Yamada, Kusatsu (JP); Masaki Hanada, Kusatsu (JP)

(73) Assignee: International Business Machines Corporation, Armonk, NY (US)

( * ) Notice: Subject to any disclaimer, the term of this patent is extended or adjusted under 35 U.S.C. 154(b) by 369 days.

(21) Appl. No.: 10/068,400

(22) Filed: Feb. 6, 2002

(65) Prior Publication Data
US 2002/0108707 A1    Aug. 15, 2002

(30) Foreign Application Priority Data
Feb. 13, 2001    (JP)    ............... 2001-036209

(51) Int. Cl.
B29C 65/00    (2006.01)
B32B 37/00    (2006.01)
G01F 1/13    (2006.01)

(52) U.S. Cl. ............... 156/272.2; 156/275.5; 156/275.7; 156/282; 156/311; 156/321; 219/380; 219/678; 219/681; 349/187; 438/118; 438/119

(58) Field of Classification Search ............ 156/272.2, 156/275.5, 275.7, 252, 311, 321; 438/118, 438/119; 219/678, 680, 681; 349/187
See application file for complete search history.

(56) References Cited

U.S. PATENT DOCUMENTS

| | | | | |
|---|---|---|---|---|
| 4,951,418 A | | 8/1990 | Keys ............... | 49/440 |
| 5,668,700 A | * | 9/1997 | Tagusa et al. ............... | 361/779 |
| 5,847,796 A | * | 12/1998 | Uchiyama et al. ........... | 349/151 |
| 6,034,818 A | * | 3/2000 | Sedlmayr ............... | 359/497 |
| 6,395,124 B1 | * | 5/2002 | Oxman et al. ........... | 156/275.5 |

FOREIGN PATENT DOCUMENTS

| | | |
|---|---|---|
| JP | 60-243114 | 3/1985 |
| JP | PUPA 62-15277 | 1/1987 |
| JP | 62-194740 | 12/1987 |
| JP | 206220 | 1/1990 |
| JP | PUPA6-207146 | 7/1994 |
| JP | 08-087019 | 2/1996 |
| JP | 08-087020 | 2/1996 |
| JP | PUPA8-511572 | 12/1996 |
| JP | 2568853 B2 | 1/1997 |
| JP | PUPA10-508323 | 8/1998 |
| JP | PUPA10-306259 | 11/1998 |
| JP | PUPA11-1507 | 1/1999 |
| JP | 11-502542 | 2/1999 |
| JP | PUPA11-35643 | 2/1999 |
| JP | PUPA 11-116611 | 4/1999 |
| JP | 2000-285730 | 10/2000 |
| JP | PUPA 2001-131527 | 5/2001 |
| JP | PUPA 2002-105110 | 4/2002 |
| WO | WO 00/22060 | 4/2000 |

* cited by examiner

Primary Examiner—Justin R. Fischer
(74) Attorney, Agent, or Firm—Arthur J. Samodovitz; Lawrence R. Fraley

(57) ABSTRACT

A bonding method and apparatus for performing same in which a first member (e.g., a silicon chip) is bonded to a second member (e.g., a glass substrate such as a PCB) using a thermosetting resin adhesive. Near infrared rays are directed onto the second member, some of these passing through the second member to also heat the adhesive. A heater is pressed onto the first member and also heats the first member. Selective cooling is also utilized to assure an acceptable temperature gradient between both members and thereby prevent distortion of same which could harm the resulting structure.

13 Claims, 7 Drawing Sheets

BONDING METHOD AND APPARATUS

FIELD OF THE INVENTION

The present invention relates to a bonding method in which a resin material is subjected to infrared irradiation for heating and curing. In particular, the present invention relates to a bonding method suitable for bonding a liquid crystal display panel and a driver circuit substrate by infrared radiation onto thermosetting resin, and to an apparatus for providing such bonding.

BACKGROUND OF THE INVENTION

Liquid crystal display devices are remarkably widespread as image display devices for personal computers and various other monitors. In general, such a liquid crystal display device comprises an illuminating backlight (a planar light source) behind a liquid crystal display panel, the light irradiating the liquid crystal panel which provides a certain spread of even brightness. An image is thus formed on the liquid crystal display panel.

Such a liquid crystal display device includes the aforementioned liquid crystal display panel (which is typically composed of two glass substrates and a liquid crystal material sealed therebetween), a printed circuit substrate for driving the liquid crystal material on the display panel, the described backlight unit disposed behind the liquid crystal display panel, and an exterior frame for holding (and covering) these components. In a thin-film transistor (TFT) liquid crystal display device, one of the glass substrates constituting the display panel includes an array substrate, and the other glass substrate includes a color filter substrate. On the array substrate (in addition to TFTs as driver elements of the liquid crystal material, display electrodes, and signal lines) are formed extraction electrodes for electrical connection to the above-mentioned printed circuit substrate and the like. Since the TFTs are arranged on the glass substrate, the glass substrate is referred to as an array substrate. On the color filter substrate (in addition to color filters) are formed common electrodes, black matrix and the like.

The printed circuit substrate is generally connected to (or mounted on) the extraction electrodes via a tape-automated bonding (TAB) tape carrier (hereinafter simply referred to as a "TAB") formed on the array substrate. Input lead conductors of the TAB are connected to corresponding electrodes of the printed circuit substrate by solder, for example. Meanwhile, output lead conductors of the TAB are connected to corresponding extraction electrodes of the array substrate. An anisotropic conductive film (ACF) or an anisotropic conductive paste (ACP) has been conventionally used to connect the output lead conductors of the TAB to the corresponding extraction electrodes of the array substrate.

Besides assembly using TAB, another assembly technique called chip on glass (COG) may be used. COG is a technique to bond an IC silicon chip (hereinafter referred to as a "silicon chip") onto the array substrate with the ACF or ACP.

The ACF or the ACP (hereinafter collectively referred to as the "ACF") comprises a resin material as an adhesive with particles composed of a conductive material dispersed therein. There are two types of ACF, namely, thermoplastic ACF that uses thermoplastic resin as an adhesive and thermosetting ACF that uses thermosetting resin as an adhesive.

Thermal pressurization (involving heating and pressurizing) is commonly used in both thermoplastic ACF and thermosetting ACF bonding techniques. An example of a bonding technique using thermal pressurization will be described with reference to FIG. 6. FIG. 6 shows an apparatus for bonding a silicon chip 121 onto an array substrate 123 of a liquid crystal display panel 120 with ACF 124. A color filter 125 and a polarizer 126 are also parts of panel 120. The bonding apparatus is comprised of a heater tool 111 (having an internal heater (not shown)) and a back-up block 116.

When silicon chip 121 is bonded onto array substrate 123, as shown in FIG. 6, heater tool 111 is heated while sandwiching array substrate 123, silicon chip 121 and ACF 124 between heater tool 111 and back-up block 116. The heat from heater tool 111 is conducted to ACF 124 via silicon chip 121. ACF 124 is therefore heated and cured by this thermal conduction. Another example of a heating method is a pulse heating method, in which heat loss of metal generated by application of a large electric current with a low-frequency pulse to heater tool 111 is utilized to instantly generate heat. The pulse heating method has an advantage of the large freedom of temperature and pressure profiles. Such bonding methods incur various problems, particularly when applied to a large-sized liquid crystal display panel requiring a narrow pitch and a narrow frame. One such problem is an occurrence of uneven assembly caused by a difference in contraction between the array substrate abutting on the ACF and a TAB or silicon chip after thermal expansion which occurs when assembling such TABs made of polyimide and the like and objects for assembly composed of silicon chips and the like. The uneven assembly occurs in part due to the adhesive power of the ACF.

Such occurrence of unevenness becomes particularly evident upon assembling a silicon chip because of its high rigidity compared to that of the typically flexible TAB. This is a major factor affecting assembling of silicon chips for use with large-sized, high-definition liquid crystal display panels. In the case of assembling the TAB component of the assembly, the occurrence of uneven assembly is not as significant because polyimide has sufficiently low rigidity compared to that of glass.

FIGS. 7A to 7C are views illustrating formation of an uneven assembly.

In FIG. 7A, heater tool 111 is a heater for heating the TAB or silicon chip 121 by thermal conduction. Silicon chip 121 is placed on array substrate 123 via thermosetting ACF 124. If the temperature necessary for curing ACF 124 is 210 degrees Celsius, for example, then a heating temperature of heating tool 111 should be set at about 250 degrees Celsius. In this example, a temperature of a bottom surface of array substrate 123 reaches about 70 degrees Celsius. That is, a substantial heat gradient arises in a direction from silicon chip 121 to array substrate 123 (depicted by the downward arrow in FIG. 7A). FIG. 7B is a view showing a state of a cooling process after ACF 124 has been heated. Chip 121 contracts when its temperature drops, in a direction illustrated by the two upper arrows in the upper part of FIG. 7B. Array substrate 123 contracts similarly in a direction illustrated by the two lower arrows in the lower part of FIG. 7B. It should be noted that lengths of these arrows also represent magnitude of contraction, those relating to chip 121 indicating greater contraction than those of array substrate 123.

FIG. 7C represents a state in which ACF 124 is completely cured and that silicon chip 121 is thus firmly bonded to array substrate 123. In this event, since a heating temperature of array substrate 123 is lower than a heating temperature of silicon chip 121, silicon chip 121 shows greater contraction. Accordingly, as shown in FIG. 7C, silicon chip 121 and array substrate 123 bound by ACF 124 are all distorted (curved). In FIG. 7C, the resulting camber has chip 121 on its inner curve, due to the greater contraction of chip 121 compared to array substrate 123. As array substrate 123 becomes thinner in response to a demand for thinner liquid crystal display devices in the future, or in the event that low-rigidity glass is used for array substrate 123, such distortion (camber occurrence) may pose a major assembly problem.

A second problem is that color filter 125 (FIG. 6) and the like may be damaged by heat from heater tool 111 should the heater tool come too close to this component during heating. One example of a temperature required for curing ACF 124 ranges from approximately 170 degrees Celsius to 230 degrees Celsius; however, as indicated above, the heating temperature of heater tool 111 is higher (e.g., in the example, about 30 to 40 degrees Celsius).

Accordingly, substantial heat may be applied to the liquid crystal material, adhesive, color filter pigments, polarizers and the like of the liquid crystal display panel. Such heat, as understood, presents a risk of deforming the liquid crystal material and the seal adhesive.

Japanese Patent No. 2568853 discloses a technology for curing a thermoplastic ACF by irradiation of infrared rays. According to this patent, heat for curing the ACF is generated by irradiation of the infrared rays onto the ACF. This heating presents an opportunity to avoid some of the above-described problems. However, the technology does not propose any effective measures to prevent occurrence of the cambers caused by the different temperature gradients.

Japanese Patent Laid-Open Publication Hei 5(1993)-206220 also discloses a technology for heating and curing the ACF by irradiation of infrared rays. However, according to the technology disclosed in this Laid-Open Publication, a tape carrier package (TCP), which is an object of bonding using the ACF, is preheated and then irradiated by the infrared rays, heating the ACF using the heat generated thereabout. Accordingly, this approach also presents a problem due to the temperature gradients. Moreover, this technology requires coating the TCP with a black carbon material for facilitating absorption of the infrared rays and blending of a similar coating material into the ACF for facilitating absorption of the infrared rays. Such requirements add cost to the assembly process (and resulting product) because these require the added coating step and/or blending of the coating material.

OBJECTS AND SUMMARY OF THE INVENTION

It is, therefore, a primary object of the present invention to enhance the bonding art, particularly where a glass substrate and adhesive are utilized.

It is another object of the invention to enhance such bonding art wherein the resulting product is a display panel, particularly a liquid crystal display panel.

It is yet another object of the invention to provide such an improved method which can be implemented at less cost compared to various existing bonding methods, this also resulting in a less costly end product.

According to one aspect of the invention, there is provided a bonding method of bonding first and second members to one another, the bonding method comprising the steps of positioning thermosetting resin between the first member and the second member, bonding the first member to the second member by heating and curing the thermosetting resin by irradiation of electromagnetic waves onto the thermosetting resin, wherein the second member is composed of a material that absorbs a first part of the electromagnetic waves and allows a second part of the electromagnetic waves to pass therethrough, and the second part of the electromagnetic waves passing through the second member irradiating the thermosetting resin.

According to another aspect of the invention, there is provided a bonding method for bonding first and second members to one another, the bonding method comprising the steps of positioning thermosetting resin between the first member and the second member, heating the thermosetting resin to a curing temperature, cooling the heated thermosetting resin, and executing a temperature difference suppression procedure during the cooling of the thermosetting resin to effectively reduce the temperature difference between the first and second members to an acceptable level.

According to yet another aspect of the invention, there is provided a bonding apparatus for performing bonding of a first member to a second member using a thermosetting resin adhesive that is heated and cured during the bonding, the bonding apparatus comprising a support member adapted for having the second member positioned thereon, a light source that generates near infrared rays for heating the thermosetting resin adhesive, the near infrared rays passing through the support member, a heater for heating the first member, and a cooling system for cooling the first member and the second member.

According to still another aspect of this invention, there is provided a bonding method for bonding a silicon chip and a glass substrate using thermosetting resin, the bonding method comprising the steps of positioning thermosetting resin between the silicon chip and the glass substrate, heating the silicon chip to a specified temperature, irradiating near infrared rays onto the glass substrate to heat the glass substrate, a part of the near infrared rays passing through the glass substrate for irradiating the thermosetting resin, the thermosetting resin being heated by the part of the near infrared rays and the heat generated by the glass substrate as a result of the near infrared rays irradiating the glass substrate, and cooling the heated silicon chip, the thermosetting resin and the glass substrate so as to assure an acceptable temperature difference between the silicon chip and the glass substrate during the cooling.

BRIEF DESCRIPTION OF THE DRAWINGS

For a more complete understanding of the present invention and the advantages thereof, reference in now made to the following description taken in conjunction with the accompanying drawings.

BEST MODE FOR CARRYING OUT THE INVENTION

Figure 1:
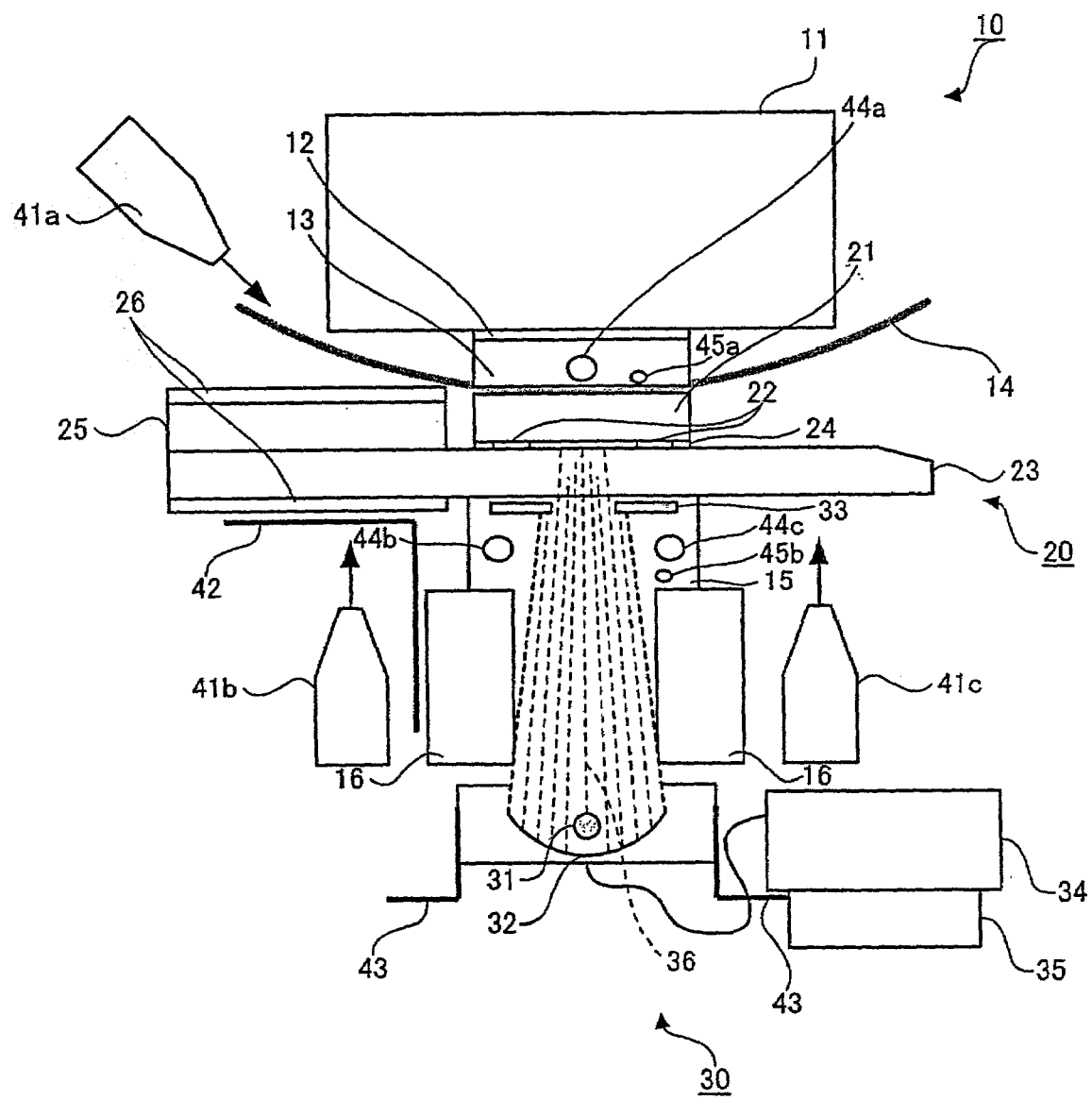
FIG. 1 is a view showing a panel assembly apparatus according to an embodiment of the present invention.

The panel assembly apparatus shown in FIG. 1 is an apparatus for assembling a silicon chip 21 on a liquid crystal display panel 20. Display panel 20 includes an array substrate 23 fitted with a polarizer 26 on its bottom surface and a color filter 25 fitted with polarizer 26 on its top surface, with a specified space provided therebetween. As indicated, substrate 23 is of conventional dielectric material, one example being epoxy resin reinforced with fiberglass (hereinafter glass), known in the industry as "FR-4". Other known printed circuit board (PCB) materials for substrate 23 are also possible. On a bottom surface of silicon chip 21 are formed bumps 22 (preferably comprised of gold). Bumps 22 achieve electrical connection between silicon chip 21 and extraction electrodes (not shown) formed on array substrate 23. Bonding of silicon chip 21 and array substrate 23 is performed using a thermosetting ACF 24. Recall the term ACF is used herein to include an anisotropic conductive film and/or paste.

The panel assembly apparatus shown in FIG. 1 comprises a heating/pressurizing system for heating and pressurizing silicon chip 21, a near infrared-ray irradiation system 30 for irradiating near infrared rays 36, and a cooling system for cooling down the heat generated by the curing of thermosetting ACF 24.

Heating/pressurizing system 10 comprises a pressurizing block 11, heat insulator 12, heater tool 13, pressure buffer 14, holding (or supporting) block 15 (preferably made of fused silica adapted for industrial use), and back-up blocks 16.

Pressurizing block 11 is a block for bonding silicon chip 21 to array substrate 23 using compression. It is desirable that hardened steel with a small coefficient of linear expansion be used for pressurizing block 11.

Heat insulator 12 thermally insulates pressurizing block 11 from heater tool 13. More specifically, insulator 12 serves to reduce excessive heat from reaching block 11 which might cause the block to overly expand. Therefore, porous ceramics may be used therefor. However, other materials including high rigidity and low deformation and deflection characteristics can be used. Heater tool 13 is preferably a small-sized constant heater with a planar deposition heater formed at the center thereof. As for a basic substance thereof, it is desirable to use ceramics, which are highly reactive in heating and cooling, and high in rigidity while also possessing low deflection when exposed to heat and pressure.

Pressure buffer 14 is provided between heater tool 13 and silicon chip 21. Pressure buffer 14 is relatively thin, particularly in a case where a TAB is bonded to array substrate 23. In the case of bonding highly rigid materials together, such as silicon chip 21 and array substrate 23, mutual plane accuracy is rare between both components due to undulations of the respective bonding surfaces thereof. As a result, unevenness of pressure occurs between silicon chip 21 and array substrate 23, which in turn could result in an improper connection. Pressure buffer 14 is provided to avoid this imperfect connection, while still possessing enough elasticity to enable even planar pressure to be applied to the compressively bonded surfaces. A material such as one based on silicon rubber, an aramide tape, or a polyimide film (e.g., Kapton made by E. I. du Pont de NeMours & Company) can be used for buffer 14.

Supporting block 15 supports liquid crystal display panel 20 positioned thereon, while back-up blocks 16 in turn support block 15. Supporting block 15 is composed of fused silica adaptable for industrial use, to also assure that near infrared rays 36 radiated from beneath the blocks will be transmitted up through supporting block 15 to satisfactorily reach array substrate 23. The industrial fused silica also possesses low thermal conductivity, with one example therefore being Pyrex (brand name). As for back-up blocks 16, it is desirable to use high-rigidity metal with good thermal conductivity and a relatively small coefficient of linear expansion.

Near infrared-ray irradiation system 30 comprises a lamp 31, a reflective mirror 32 that receives and reflects the near infrared rays 36 emitted from lamp 31, a shutter (mask) 33 that transmits light received directly from lamp 31 and indirectly from the reflective mirror 32, an infrared rays (I/R) unit controller 34 that controls radiation of the infrared rays 36 from the lamp 31, and a heat exchanger 35. All are depicted in FIG. 1.

Near infrared rays 36 emitted from lamp 31 irradiate array substrate 23 and thermosetting ACF 24. As later described in detail, near infrared rays 36 preferably have wavelengths ranging from 800 to 1200 nm. In this embodiment, a quartz infrared halogen lamp is preferably used as lamp 31, which lamp has a filament disposed at the center of a fused silica bulb filled with a halogen gas. Halogen lamps are known in the art and further description is not deemed essential.

Reflective mirror 32, having a parabolic reflecting surface, reflects near infrared rays 36 emitted from lamp 31, as described above. For this reason, lamp 31 is located on a focal point of reflective mirror 32.

Slits with specified widths are formed in shutter mask 33. Accordingly, only near infrared rays 36 that pass through these slits will irradiate array substrate 23. That is, shutter mask 33 has a function of radiating near infrared rays 36 only onto portions of array substrate 23 that require heat for bonding. Here, shapes or sizes of the slits of shutter mask 33 are not particularly limited, and they can be appropriately set in accordance with shapes and areas of the portions that require the heat. As a matter of course, a plurality of different shutter masks 33 may be prepared and exchanged in response to differently shaped objects being bonded. Moreover, shutter mask 33 is preferably of a material that does not absorb infrared rays, such material including stainless steel, aluminum, or a chromium-plated glass can be used.

I/R unit controller 34 incorporates a power source and a control circuit for controlling electric current flowing in the filament of lamp 31, to thereby assure appropriate temperature profiles. Heat exchanger 35 is a cooling system that incorporates the entire near infrared-ray irradiation system 30 into a circulatory cooling apparatus.

Next, description will be made regarding a cooling system for cooling down the heat generated by the assembly apparatus of the embodiment.

The cooling system preferably comprises three cooling nozzles 41a, 41b and 41c, a heat sink 42 and cooling fins 43. At least one of the cooling nozzles (i.e., 41a in FIG. 1) is provided to prevent excessive heat generated by heater tool 13 from reaching polarizer 26 via the pressure buffer 14. Further, at least two cooling nozzles (41b and 41c) are provided to prevent excessive heat generated by array substrate 23 from reaching color filter 25 and polarizer 26. If color filter and polarizer 26 are heated to too high a temperature, deformation or deterioration of these components may occur. In addition, the cooling nozzles also prevent other peripheral components (not shown) than filter 25 and polarizers 26 from such heat deterioration. The cooling nozzles discharge cooling gas from the tips thereof. The gas being discharged may be either cooled or of normal room temperature as long as the aforementioned excessive heat flow is prevented.

Heat sink 42 is provided to prevent excessive heat from array substrate 23 reaching the polarizer 26 positioned on the undersurface of array substrate 23.

Cooling fins 43 are used to provide effective heat removal from irradiation system 30 to the outside (away from the system 30).

A cooling hole 44a is formed in heater tool 13, and cooling holes 44b and 44c are formed in the underlying supporting block 15. Cooling holes 44a, 44b and 44c also constitute part of the invention's cooling system. Heater tool 13 is cooled by supplying a cooling medium to cooling hole 44a. Similarly, supporting block 15 is cooled by supplying a cooling medium to cooling holes 44b and 44c. The cooling medium to be supplied to cooling holes 44a, 44b and 44c is not particularly limited; however, air is preferred. The temperature of heater tool 13 is detected by temperature sensor 45a, and the temperature of supporting block 15 is detected by temperature sensor 45b. It should be noted that temperature detection may also be taken directly on silicon chip 21 or array substrate 23. The temperature profiles at heater tool 13 and supporting block 15 are controlled by change in flow velocity of air supplied to cooling holes 44a, 44b and 44c, in accordance with temperature information obtained by temperature sensors 45a and 45b. Such control in turn allows the system operator to control the temperatures of silicon chip 21 and array substrate 23, which control is very important to successful operation of the invention. Effective supply of air to cooling holes 44b and 44c serves to minimize the temperature difference between array substrate 23 and silicon chip 21, especially during cooling of silicon chip 21. That is, accelerated cooling of array substrate 23 substantially eliminates the occurrence of a camber problem described hereinabove, said problem attributed to an extreme difference of contraction.

A method of assembling a liquid crystal display structure with reference to the flowchart illustrated in FIG. 2, e.g., using the systems of FIG. 1, will now be described.

First, an array substrate 23 (also referred to as a subject or object) is positioned on supporting block 15 while a silicon chip 21 is placed on array substrate 23 using thermosetting ACF 24 (ACF 24 of course being deposited on the substrate and/or chip 21 prior to such chip positioning). Heater tool 13 next contacts silicon chip 21 via pressure buffer 14. This is step S101 in FIG. 2. Next, heater tool 13 is heated, causing silicon chip 21 to in turn be heated (by conductive heat passing from the tool through pressure buffer 14 (S102). Such heating is referred to as preheating. By preheating silicon chip 21, a temperature gradient in a direction from silicon chip 21 to array substrate 23 will be reduced. Such preheating is referred to as thermal conductive heating, a phenomenon in which heat is generated due to excitation of molecules abutting on a heated substance owing to the thermal energy thereof. That is, thermal conductive heating of chip 21 is heat generation resulting from transition of the temperature from the external, solid heater tool 13.

This thermal conductive heating results in excitation of the molecules constituting silicon chip 21, owing to the thermal energy generated by heater tool 13. The heat gradually excites abutting molecules, whereby the entire silicon chip will be eventually heated. In addition, thermal conduction from silicon chip 21 to thermosetting ACF 24 also occurs, resulting in heating of the thermosetting ACF 24 as well.

Since the thermal conductive heating by heater tool 13 is performed during application of pressure by block 11 onto pressure buffer 14, pressure buffer 14 is also heated. Thermal conductive heating is also generated within the heated pressure buffer 14, this heat subsequently spreading over the entire area of pressure buffer 14. In this embodiment, the pressure buffer is cooled by the cooling gas discharged from an adjacent cooling nozzle (41a). Accordingly, it is possible to avoid a problem of deformation or deterioration of polarizer 26 provided on color filter 25 from heat generated by the pressure buffer 14 as a result of heat from heater tool 13.

Figure 2:
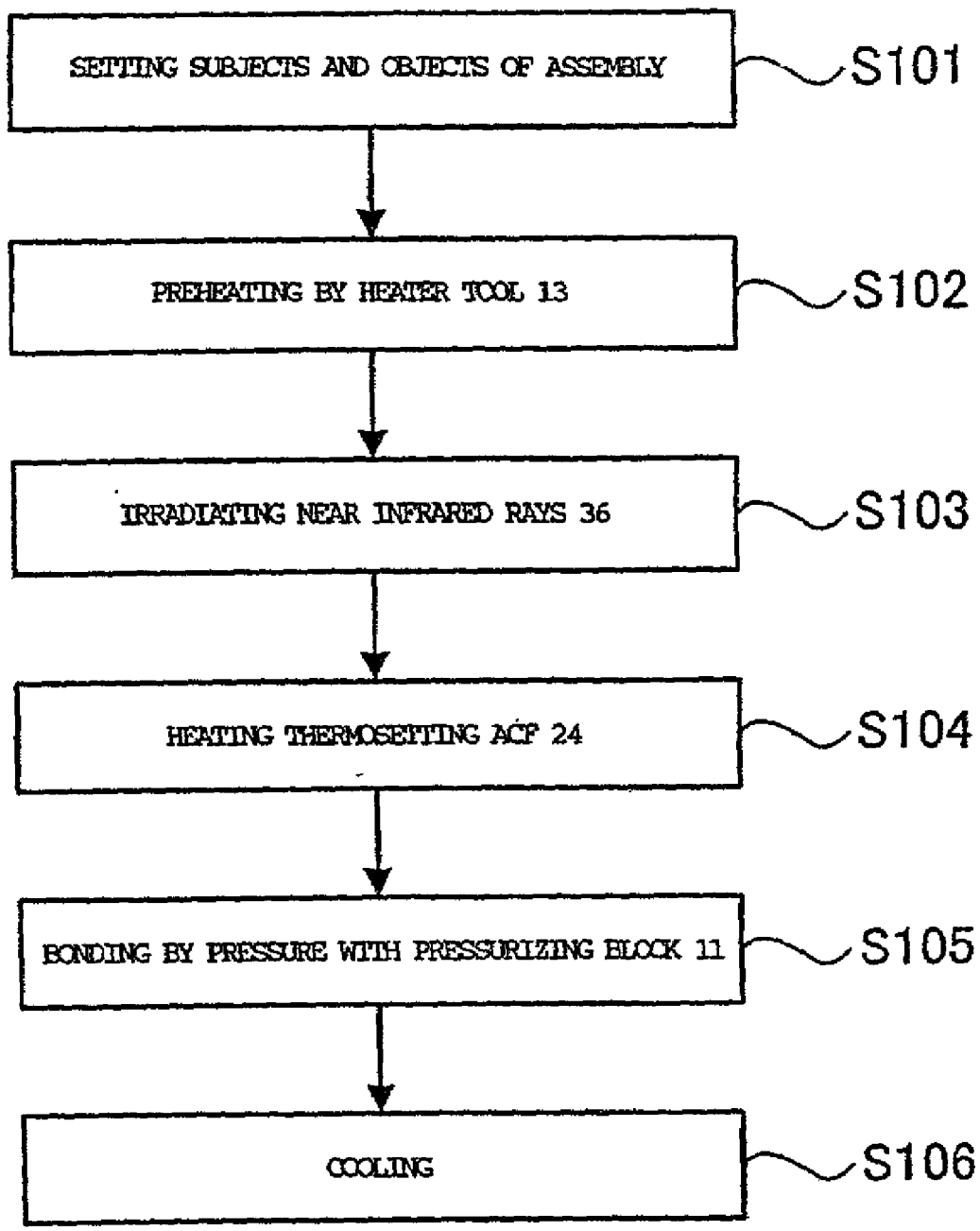
FIG. 2 is a flowchart showing a process of bonding according to one embodiment of the present invention.

When preheated silicon chip 21 reaches a specified temperature, near infrared rays 36 are emitted from lamp 31 (S103, FIG. 2). Near infrared rays 36 emitted from lamp 31 located at the focal point of reflective mirror 32 are reflected and converged by reflected mirror 32, in addition to passing upwardly in a direct manner to substrate 23. The near infrared rays 36 are intercepted by shutter mask 33, except for portions of array substrate 23 that require bonding, such irradiation reaching array substrate 23. The part of the near infrared rays that reach the array substrate are absorbed by the substrate 23, while another part is further transmitted through array substrate 23 to reach thermosetting ACF 24. In this process, radiant heat is generated immediately after irradiation of near infrared rays 36 onto array substrate 23. Such radiant heat is a phenomenon in which heat is generated in a state of molecular excitation caused by loosening of molecular bindings caused by radiation of a certain kind of electromagnetic waves (microwaves) onto the receiving structure (here, a substrate). The proper selection of wavelength to cause such heat is dependent on the structure of the molecular make-up of the receiver, and can be adjusted according to such make-up. The radiant heat generated within array substrate 23 attempts to move to other parts of the substrate than the portion where near infrared rays 36 impinge (after passing through shutter 33's aperture in FIG. 1). However, in this embodiment, such heat also passes through heat sink 42 and is thus cooled down by the cooling gas discharged from the cooling nozzles 41b and 41c. Other heat generated within substrate 23 is cooled by the other cooling nozzles. By performing heat radiation and cooling as described above, polarizer 26 disposed under array substrate 23 is prevented from deformation or burn caused by the radiant heat of array substrate 23. In addition to polarizer 26, color filter 25 is also prevented from deterioration caused by thermal conduction.

Here, the embodiment has been described with respect to the use of near infrared rays 36. Conventional thermosetting ACF shows higher absorption rates with short-wave visible light or ultraviolet light. However, as a heat source for generating radiant heat, near infrared light is easier to handle and control. Moreover, heat generation is required at array substrate 23 (which may include glass as a component thereof, if the substrate is formed of known dielectric materials used for printed circuit boards and the like), in order to reduce an undesirable gradient. For these reasons, the embodiment applies the near infrared rays; particularly near infrared rays 36 having wavelengths ranging from 800 to 1200 nm. Accordingly, near infrared rays 36 that are transmitted through array substrate 23 and which reach thermosetting ACF 24 are able to generate sufficient heat to efficiently heat thermosetting ACF 24. Further, thermosetting ACF 24 is heated by thermal conductive heating from array substrate 23. In this way, thermosetting ACF 24 will receive heating by irradiation of near infrared rays 36 and thermal conductive heating from array substrate 23 simultaneously (S104). When thermosetting ACF 24 is heated up to a specified temperature, irradiation of near infrared rays 36 is terminated.

In the next step, silicon chip 21 and array substrate 23 are pressed together by pressure indirectly applied to silicon chip 21 by pressurizing block 11 (S105). As understood, substrate 23 is firmly supported by block 15. Thereafter, silicon chip 21, thermosetting ACF 24 and array substrate 23 are cooled to room temperature (S106). Here, silicon chip 21 and the glass component that constitutes array substrate 23 have approximately the same degrees of contraction. Thus, in this cooling process, an unacceptable temperature difference (gradient) between the silicon chip and array substrate is prevented in order to achieve such uniform contraction. After thermosetting ACF 24 is cured, silicon chip 21 and array substrate 23 become electrically conductive to each other owing to the conductive particles contained in thermosetting ACF 24. According to the embodiment, while silicon chip 21 is preheated, the radiant heat generated at array substrate 23 is utilized for heating thermosetting ACF 24, thereby reducing an unacceptable temperature gradient in a direction from chip 21 to substrate 23. This will be described in detail with reference to FIGS. 3A to 3C.

Figure 3A:
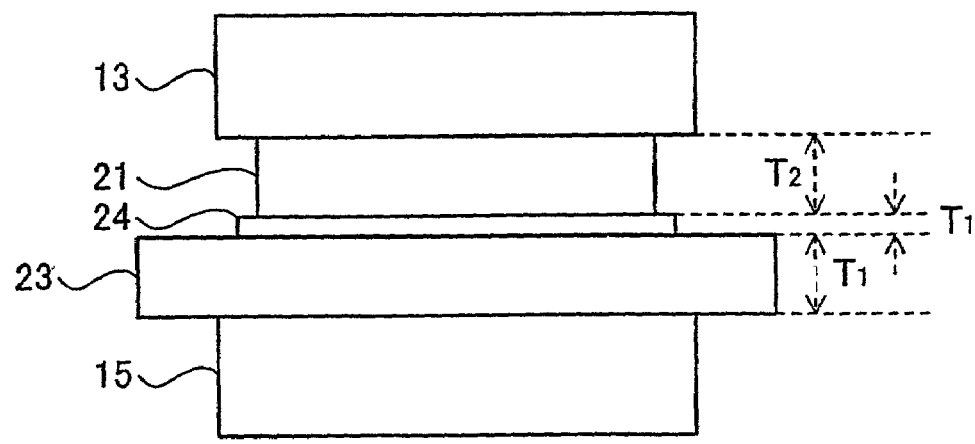
FIGS. 3A to 3C are views showing temperature gradient and thermal expansion in one embodiment of the present invention.

Since heat is generated in array substrate 23 by irradiation of near infrared rays 36, a temperature gradient of array substrate 23 in a thickness direction is significantly reduced, or, possibly prevented altogether. A temperature on both upper and lower surfaces of array substrate 23 (on the assumption that the temperature gradient is prevented or significantly reduced) is denoted by T1, as illustrated in FIG. 3A. Moreover, since thermosetting ACF 24 is also heated by the radiant heat of near infrared rays 36 that are transmitted through the array substrate and further by the conductive heat from the array substrate, the temperature of ACF 24 can be regarded as equivalent to the temperature of the underlying substrate. In other words, the temperature of both surfaces of thermosetting ACF 24 becomes T1; hence the reason for two "T1" temperature indications in FIG. 3A. In addition, as silicon chip 21 is preheated, it is possible to set a preheating temperature T2 such that a difference between T1 and T2 is minimized. Here, since thermal conduction also occurs from thermosetting ACF 24 to silicon chip 21, the preheating temperature for the chip is established by taking such heating (by the conductive heat) into consideration.

As described above, the temperature gradient in the direction from silicon chip 21 to array substrate 23 can be reduced by preheating silicon chip 21 using heater tool 13, the radiant heat from thermosetting ACF 24, and by the conductive heat from array substrate 23. If only heater tool 13 were used to supply heat to the chip, a large (and possibly unacceptable) temperature gradient would occur in the direction from the chip to the substrate.

Figure 3B:
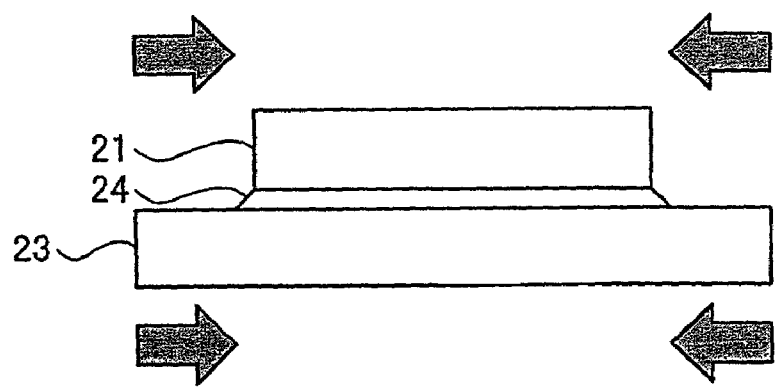
Figure 3C:
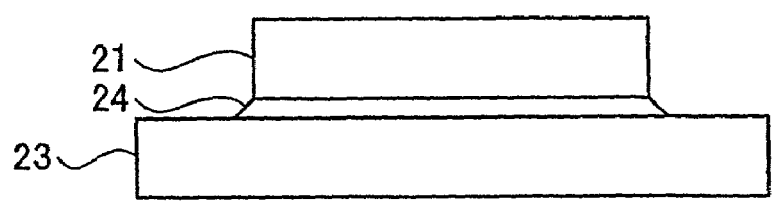

FIG. 3B is a view showing a cooling process after heating. In an initial stage of cooling, as described in the explanation for FIG. 3A, the temperature gradient from silicon chip 21 to array substrate 23 is small or virtually nonexistent. As a result, the temperature difference between silicon chip 21 and array substrate 23 during the cooling process is acceptable such that the degrees of contraction of silicon chip 21 and of array substrate 23 are substantially equal, as indicated by the substantially same-sized arrows in FIG. 3B. When such degrees of contraction are substantially equal, an occurrence of a camber of the substrate with the chip secured thereto will be substantially eliminated, as shown in FIG. 3C.

In FIGS. 4A to 4E, white arrows are used to represent directions of thermal conduction, and dotted arrow lines used to represent near infrared rays 36. Also, the shading of individual parts is meant to represent temperatures of the respective element, the darker color representing the higher temperature.

Figure 4A:
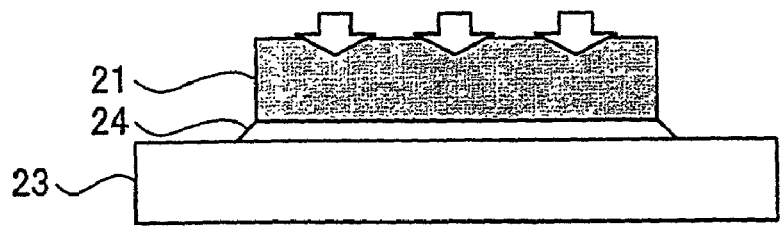
FIGS. 4A to 4E are views for describing effects as a result of heating according to one embodiment of the present invention.
Figure 4B:
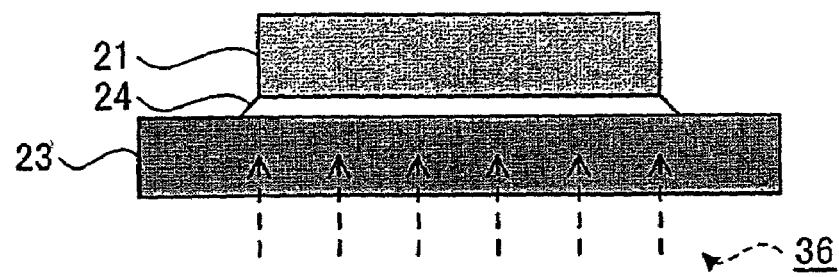
Figure 4C:
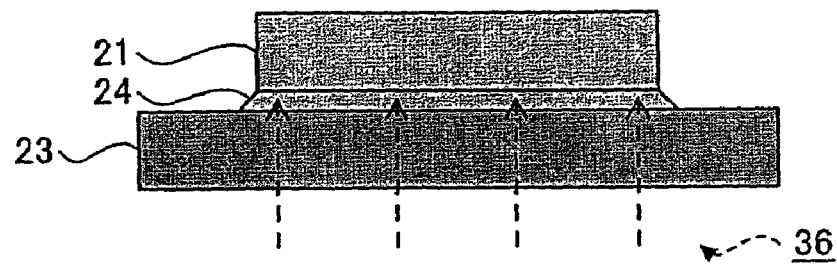
Figure 4D:
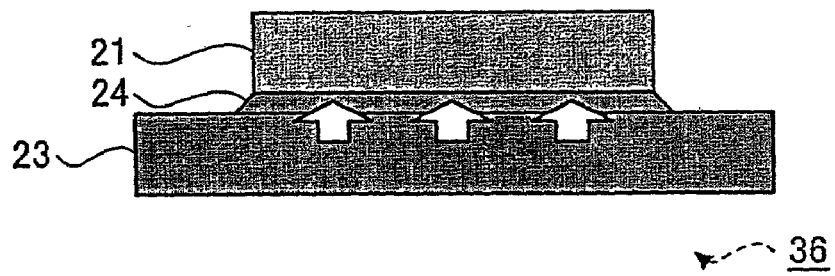
Figure 4E:
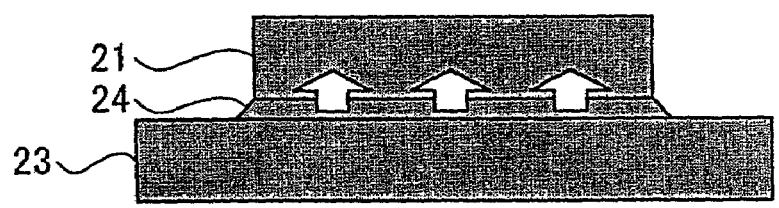

First, as shown in FIG. 4A, silicon chip 21 and thermosetting ACF 24 are preheated by the conductive heat from heater tool 13 (not shown). Next, as shown in FIG. 4B, array substrate 23 self heats due to the radiant heat generated by irradiation of near infrared rays 36. Further, as shown in FIG. 4C, thermosetting ACF 24 also self heats due to the radiant heat generated by near infrared rays 36 that pass through array substrate 23. Still further, as shown in FIG. 4D, thermosetting ACF 24 is heated by thermal conduction from the heated array substrate. (ACF 24 is shown with darker shading in FIG. 4D compared to previous FIG. 4E). As shown in FIG. 4E, thermal conduction from thermosetting ACF 24 to silicon chip 21 occurs, and thus silicon chip 21 is also heated by this conductive heat.

Here, since the temperature of silicon chip 21 rises more easily in comparison with the insulative glass that forms part of array substrate 23, heating the chip to the specified temperature is thermally more efficient than heating the substrate. Accordingly, the above described preheating of silicon chip 21 by heater tool 13 is effective in significantly reducing the temperature gradient between chip and substrate.

Moreover, utilization of three sources of heat, that from array substrate 23, thermosetting ACF 24 and heater tool 13 to collectively heat chip 21 assure increased efficiency of heating the chip.

In a preferred embodiment of the invention, preheating by heater tool 13 requires a lower temperature in comparison with a procedure during which the thermosetting ACF were heated only by the heater tool. As stated, cooling is also performed using cooling nozzle 41a, thereby suppressing adverse thermal effects on polarizer 26. Thus, utilization of cooling nozzles 41b and 41c, heat sink 42, and cooling holes 44a, 44b and 44c minimizes adverse thermal effects on the entire liquid crystal display panel 20. Still further, provision of pressure buffer 14 assures uniform pressure application by silicon chip 21 onto array substrate 23.

Figure 7A:
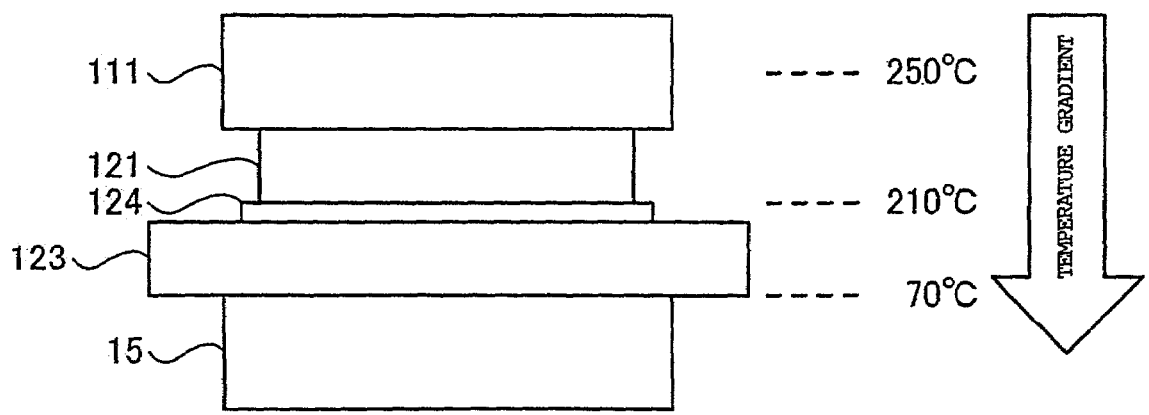
FIGS. 7A to 7C are views for describing a mechanism of contraction unevenness attributed to a temperature gradient and a difference in thermal expansion in the conventional bonding method conducted using the apparatus of FIG. 6.
Figure 7B:
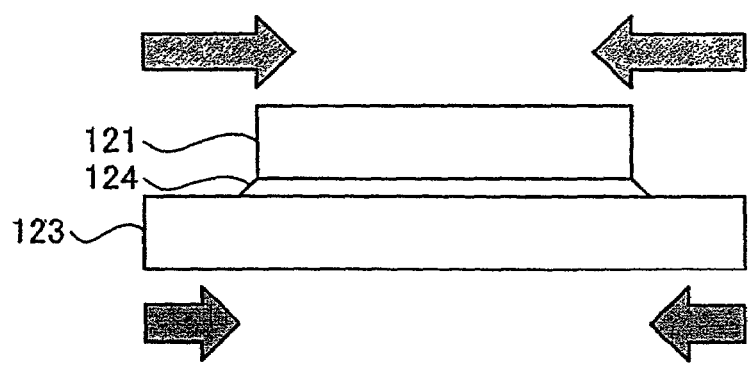
Figure 7C:

The preferred method of cooling the above-heated structure will now be described with reference to FIGS. 5A to 5C. As previously described, although the thermosetting ACF has a characteristic of curing with heat, such curing is not necessarily completed immediately after the curing reaction is initiated. During a cooling process in which the ACF is heated up to its curing point, the thermosetting ACF retains flexibility to some extent immediately after reaching said point and for a relatively short time thereafter. Therefore, in a temperature range above the glass transition temperature of the ACF, a camber as described in FIG. 7 does not occur, or it may occur only to a slight (and acceptable) degree. On the contrary, a camber may occur at a temperature range at and below this glass transition temperature of the ACF.

Figure 5A:
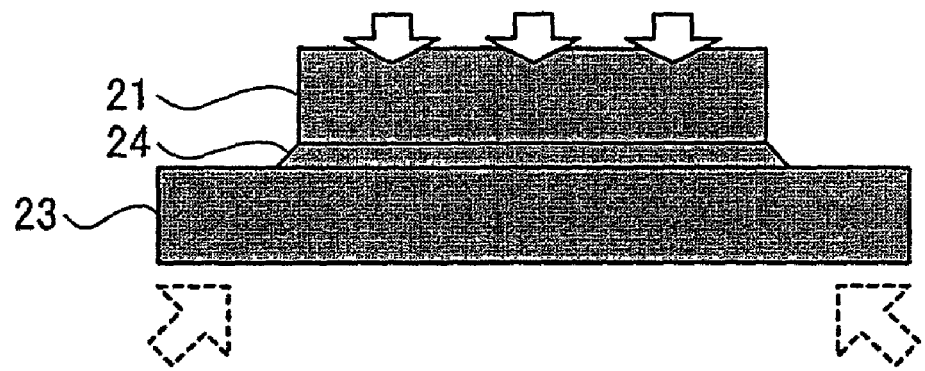
FIGS. 5A to 5C are views for describing effects as a result of cooling according to one embodiment of the present invention.
Figure 5B:
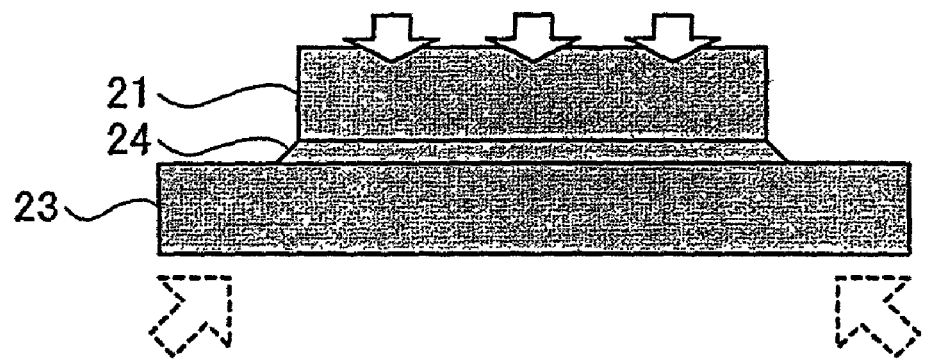
Figure 5C:
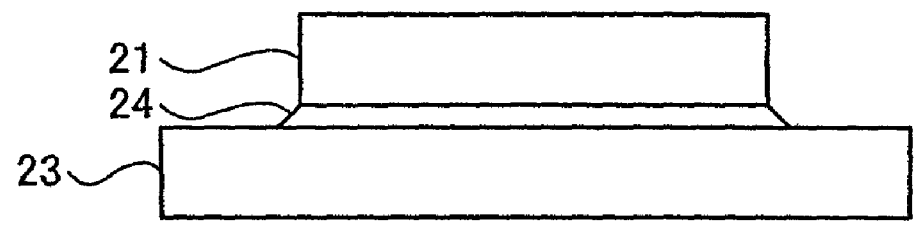
Figure 6:
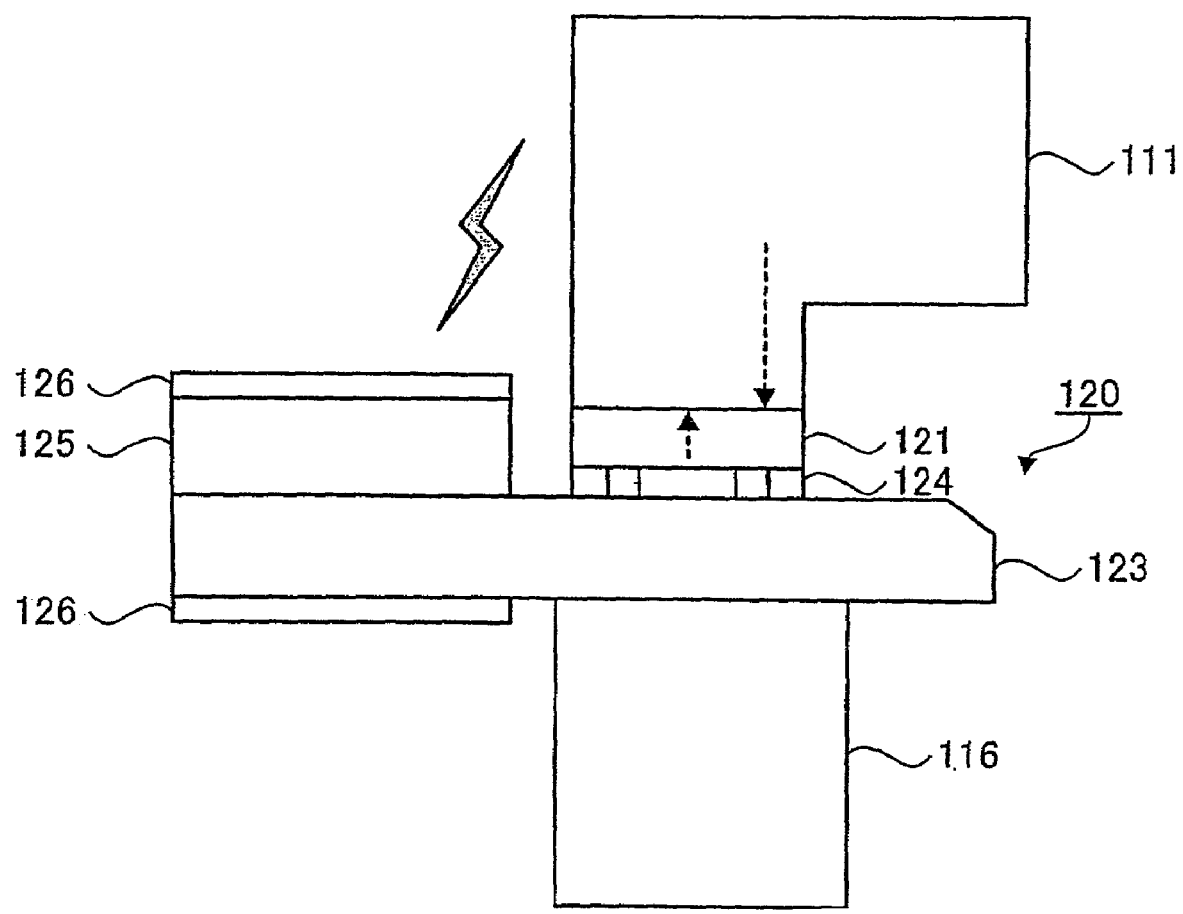
FIG. 6 is a view illustrating an apparatus for performing a conventional bonding method.

In FIGS. 5A to 5C, the solid arrows represent heating by heater tool 13, and the dotted arrows represent cooling when coolant is passed through cooling holes 44b and 44c. Similar to FIGS. 4A–4E, the shading of individual parts represent different temperatures, the darker shading representing a relatively higher temperature.

First, as shown in FIG. 5A, silicon chip 21, thermosetting ACF 24 and array substrate 23 have been heated up to a desired maximum heating temperature. If allowed at this point to be cooled without implementing the teachings of this invention, the silicon chip 21 will cool faster than array substrate 23. Accordingly, the resulting high difference of contraction between the chip and substrate may likely result in an unacceptable camber. As taught herein, heating of silicon chip 21 by heater tool 13 at this time prevents silicon chip 21 from cooling down too rapidly. Such heating is referred to as subheating (following the full heating procedure defined above). In comparison, array substrate 23 is relatively slow in cooling down compared to the chip. Cooling of array substrate 23 is accelerated by utilizing air flow through cooling holes 44b and 44c, thus reducing the temperature difference between the substrate and silicon chip 21 to an acceptable level.

Cooling of silicon chip 21, thermosetting ACF 24 and array substrate 23 progresses as shown in FIG. 5B, while performing subheating of the chip and accelerated cooling of the substrate as described above. Continued "cooling down", including the defined subheating and acceleration of cooling silicon chip 21, thermosetting ACF 24 and array substrate 23 are cooled down to room temperature, this as shown in FIG. 5C. In this way, the invention avoids the occurrence of cambers because of the treatment for suppressing the temperature difference between silicon chip 21 and array substrate 23 during the cooling process, which preferably allows such temperature difference to reach virtually zero.

In the above-described embodiment, the subheating of silicon chip 21 and accelerated cooling of array substrate 23 is performed throughout the cooling down process. However, as understood in the foregoing description, what is of particular importance is control at the glass transition temperature and the vicinity thereof, particularly where the thermosetting resin that constitutes thermosetting ACF 24 reaches its full cure temperature and remains slightly flexible in the course of at least some of the cooling process.

In the bonding method of the present invention, temperature control in a cooling process of the thermosetting resin after heating the same is important. Although the thermosetting resin has a characteristic of curing by heating, it does not necessarily mean that the resin becomes completely cured immediately after a curing reaction starts. During the cooling process, after heating up to a specified temperature, the thermosetting resin still retains flexibility to some extent, and complete curing is achieved in a temperature range at and below a glass transition temperature. Accordingly, in a temperature range above the glass transition temperature, a camber as described with reference to FIG. 7 does not occur, or it may occur only to a slight degree. On the contrary, a camber may occur in the temperature range at and below the glass transition temperature. Here, silicon chip 21 and array substrate 23 have different cooling rates when cooled down after being heated up to the same temperature because these elements have different specific heats. Specifically, silicon chip 21 is cooled down faster than array substrate 23. Accordingly, suppression of a temperature difference between the silicon chip and array substrate during the cooling process is important to prevent the occurrence of such unacceptable cambers. Therefore, the present invention provides a bonding method comprising the steps of arranging thermosetting resin between a first member and a second member, heating the thermosetting resin for curing, and cooling the heated thermosetting resin. Here, temperature difference suppression is executed during the cooling step in order to suppress a temperature difference between the first member and the second member.

Temperature control executed from the beginning can effectuate even contraction of silicon chip 21 and array substrate 23 during the cooling process down to the glass transition temperature, and it can further effectuate even contraction of silicon chip 21 and array substrate 23 at the glass transition temperature or lower. In addition, although the above-described embodiment describes a silicon chip and array substrates as examples of bonding members, the present invention is not limited to the foregoing examples but can be universally adapted to members composed of other materials.

As described above, according to the present invention, occurrence of cambers is substantially prevented because the temperature gradients between individual bonding members is significantly reduced. Further, curing of the thermosetting resin has been accelerated by utilizing both radiant and conductive heating.

While there have been shown and described what are at present the preferred embodiments of the invention, it will be obvious to those skilled in the art that various changes and modifications may be made therein without departing from the scope of the invention as defined by the appended claims.

What is claimed is:

1. A method for bonding an integrated circuit to a substrate using heat without deforming an adjacent part of said substrate having a color filter bonded thereto and a polarizer bonded onto a face of said color filter opposite said substrate, said substrate comprising an epoxy resin reinforced with fiberglass, said method comprising the steps of:
    positioning a face of said integrated circuit adjacent to a face of said substrate with a thermosetting resin between said integrated circuit and said substrate;
    supporting an opposite face of said substrate;
    positioning a face of a resilient sheet adjacent to an opposite face of said integrated circuit;
    positioning a block against an opposite face of said resilient sheet and pressing said block against said resilient sheet to force said integrated circuit toward said substrate;
    heating said block to heat said opposite face of said integrated circuit;
    applying heat to said opposite face of said substrate concentrated in a region opposite said integrated circuit by irradiating said substrate with near infrared light while avoiding direct heating of said substrate peripheral of said region opposite said color filter and said polarizer, some energy of said light being absorbed by said substrate and some energy of said light passing through said substrate to said resin; and
    during the steps of heating said block and applying heat to said opposite face of said substrate, cooling a portion of said resilient sheet peripheral to said integrated circuit adjacent to said color filter and said polarizer to reduce indirect heating of said color filter and said polarizer from said block via said resilient sheet; wherein the step of cooling comprises the step of discharging a gas against said portion of said resilient sheet peripheral to said integrated circuit adjacent to said color filter and said polarizer.

2. A method as set forth in claim 1 wherein the step of discharging a gas against said portion of said resilient sheet peripheral to said integrated circuit adjacent to said color filter and said polarizer comprises the step of discharging said gas toward said block against a surface of said resilient sheet.

3. A method as set forth in claim 1 wherein said step of discharging said gas comprises the step of discharging said gas against a surface of said resilient sheet adjacent to said block.

4. A method as set forth in claim 1 wherein said substrate also has another polarizer bonded onto said opposite face of said substrate adjacent to said region of said substrate opposite the first said polarizer; and during the steps of heating said block and applying heat to said opposite face of said substrate, cooling said other polarizer.

5. A method as set forth in claim 4 wherein said other polarizer is positioned adjacent to a heat sink, and the step of cooling said other polarizer comprises the steps of blowing air against said heat sink.

6. A method as set forth in claim 5 wherein said hear sink has one plate adjacent to said other polarizer, and another plate angled relative to said one plate to shield said plate from heat applied in the step of heating said region of said substrate.

7. A method as set forth in claim 5 wherein after the steps of heating said block and applying heat to said opposite face of said substrate, further comprising the step of cooling said block.

8. A method as set forth in claim 7 wherein the step of cooling said block comprises the step of flowing a cooling liquid through an opening in said block.

9. A method as set forth in claim 1 wherein the step of supporting an opposite face of said substrate comprises the step of supporting said opposite face of said substrate with another block, and after the steps of heating the first said block and applying heat to said opposite face of said substrate, further comprising the step of cooling said other block.

10. A method as set forth in claim 9 wherein the step of cooling said other block comprises the step of flowing a cooling liquid through an opening in said other block.

11. A method of forming a bonded assembly, said method comprising the steps of:

positioning an IC chip adjacent to a substrate with a thermosetting adhesive between said IC chip and said substrate to adhere said IC chip to said substrate, a color filter bonded to said substrate and a polarizer bonded to a face of said color filter opposite said substrate, said color filter and said polarizer being adjacent to said IC chip; and irradiating said substrate with near infrared light toward said IC chip such that some energy of said light is absorbed by said substrate and some energy of said light passes through said substrate to said adhesive to substantially cure said adhesive; and wherein the positioning step is performed by positioning a face of said IC chip adjacent to a face of said substrate with said thermosetting adhesive between said face of said IC chip and said face of said substrate, and further comprising the steps of:

supporting an opposite face of said substrate;

positioning a face of a resilient sheet adjacent to an opposite face of said IC chip;

positioning a block against an opposite face of said resilient sheet and pressing said block against said resilient sheet to force said IC chip toward said substrate;

heating said block to heat said opposite face of said IC chip; and wherein the step of irradiating said substrate is performed by applying heat to said opposite face of said substrate concentrated in a region opposite said IC chip, while avoiding direct heating of said substrate peripheral of said region opposite said color filter and said polarizer; and during the steps of heating said block and applying heat to said opposite face of said substrate, cooling a portion of said resilient sheet peripheral to said IC chip adjacent to said color filter and said polarizer to reduce indirect heating of said color filter and said polarizer from said block via said resilient sheet; wherein the step of cooling comprises the step of discharging a gas against said portion of said resilient sheet peripheral to said integrated circuit adjacent to said color filter and said polarizer.

12. A method as set forth in claim 11 wherein the step of discharging gas against said portion of said resilient sheet peripheral to said integrated circuit adjacent to said color filter and said polarizer comprises the step of discharging said gas air toward said block against a surface of said resilient sheet adjacent to said block.

13. A method as set forth in claim 11 wherein said step of discharging said gas comprises the step of discharging said gas against a surface of said resilient sheet adjacent to said block.

* * * * *